(12) United States Patent
Wu et al.

(10) Patent No.: US 7,233,538 B1
(45) Date of Patent: Jun. 19, 2007

(54) VARIABLE MEMORY REFRESH RATE FOR DRAM

(75) Inventors: Chung-Hsiao R. Wu, Sunnyvale, CA (US); Robert C. Zak, Jr., Bolton, MA (US)

(73) Assignee: Sun Microsystems, Inc., Santa Clara, CA (US)

( * ) Notice: Subject to any disclaimer, the term of this patent is extended or adjusted under 35 U.S.C. 154(b) by 110 days.

(21) Appl. No.: 10/909,705

(22) Filed: Aug. 2, 2004

(51) Int. Cl.
*G11C 7/00* (2006.01)
(52) U.S. Cl. .................... 365/222; 365/230.03
(58) Field of Classification Search ............ 365/222
See application file for complete search history.

(56) References Cited

U.S. PATENT DOCUMENTS

| | | | | |
|---|---|---|---|---|
| 6,134,167 A | * | 10/2000 | Atkinson | 365/222 |
| 6,199,139 B1 | * | 3/2001 | Katayama et al. | 365/222 |
| 6,453,218 B1 | * | 9/2002 | Vergis | 700/299 |
| 6,781,908 B1 | | 8/2004 | Pelley et al. | |
| 6,813,211 B2 | | 11/2004 | Takatsuka et al. | |
| 6,819,624 B2 | | 11/2004 | Acharya et al. | |
| 6,831,873 B1 | | 12/2004 | Glassie | |
| 6,975,556 B2 | * | 12/2005 | Schoenfeld et al. | 365/233 |
| 2005/0001596 A1 | * | 1/2005 | Lovett | 320/150 |

OTHER PUBLICATIONS

Sato, et al, "A 4-Mb Pseudo SRAM Operating a 2.6±1V with 3-μA Data Retention Current", *IEEE Journal of Solid-State Circuits*, vol. 26, No. 11, Nov. 1991, pp. 1556-1562.

* cited by examiner

*Primary Examiner*—Thong Q. Le
(74) *Attorney, Agent, or Firm*—Meyertons Hood Kivlin Kowert & Goetzel, P.C.; Erik A. Heter; B. Noël Kivlin

(57) ABSTRACT

A method and apparatus for controlling a DRAM refresh rate. In one embodiment, a computer system includes a memory subsystem having a memory controller and one or more DRAM (dynamic random access memory) devices. The memory controller is configured to periodically initiate a refresh cycle to the one or more DRAM devices. The memory controller is also configured to monitor the temperature of the one or more DRAM devices. If the temperature exceeds a preset threshold, the memory controller is configured to increase the rate at which the periodic refresh cycle is performed.

13 Claims, 3 Drawing Sheets

VARIABLE MEMORY REFRESH RATE FOR DRAM

BACKGROUND OF THE INVENTION

1. Field of the Invention

This invention relates to memory for computers and digital systems, and more particularly, dynamic random access memory (DRAM).

2. Description of the Related Art

To meet ever-increasing performance demands, the amount and density of memory in computer systems is continually increasing along with the demand for faster processors and other performance-enhancing advancements. As a result of the increasing memory demands, power consumption by memory subsystems has increased correspondingly. Increased power consumption has led to increased heat generation by memory subsystems, and thus leads to memory devices operating at a higher temperature.

The higher temperature at which some memory devices are required to operate may impact their performance and reliability. In particular, higher temperatures may impact the data reliability of dynamic random access memory (DRAM) devices. Information is stored in a DRAM in individual cells, which are essentially capacitors, storing information as an electrical charge. DRAM cells typically encounter what is known as leakage current, which causes the amount of electrical charge stored in the cell to decrease. If the amount of charge decreases enough, information stored in the cell may be compromised. Memory subsystems utilizing DRAM devices periodically provide a refresh cycle to restore the charge in the individual DRAM cells. However, higher operating temperatures tend to increase the amount of leakage current, and therefore the rate at which memory cells lose their charge. If the temperature is high enough, the periodic refresh cycles may be unable to ensure data integrity in the DRAM devices.

One method to counter the problems resulting from higher operating temperatures is to throttle memory access. A memory controller may limit access to DRAM memory devices when the temperature has exceeded a certain threshold. However, this may significantly reduce memory bandwidth, since the amount of time required for the DRAM devices to cool to a temperature below the threshold may consume a large number of memory cycles. This reduction of memory bandwidth can have a severe impact on computer system performance.

SUMMARY OF THE INVENTION

A method and apparatus for controlling a DRAM refresh rate is disclosed. In one embodiment, a computer system includes a memory subsystem having a memory controller and one or more DRAM (dynamic random access memory) devices. The memory controller is configured to periodically initiate a refresh cycle to the one or more DRAM devices. The memory controller is also configured to monitor the temperature of the one or more DRAM devices. If the temperature exceeds a preset threshold, the memory controller is configured to increase the rate at which the periodic refresh cycle is performed.

In one embodiment, a temperature may be determined by one or more temperature sensing devices located in the vicinity of one or more DRAM devices. A memory controller or other device may receive temperature inputs from the one or more temperature sensing devices. For example, a first temperature-sensing device may be associated with a first DRAM bank and a second temperature-sensing device may be associated with a second temperature-sensing device. The memory controller or other device may then adjust the refresh rates of the first and second memory banks independently of each other.

The preset threshold rate may be determined by performing memory accesses in order to increase the temperature of the DRAM devices. Error checking of the data accessed from the DRAM devices may be performed after each access. If an error is detected, the temperature recorded by a temperature-sensing device in the vicinity of the DRAM devices may be recorded. A temperature threshold value may then be set based on the recorded temperature. In some embodiments, multiple temperature thresholds may be set, and the refresh rate for the affected DRAM devices may be adjusted up or down accordingly.

BRIEF DESCRIPTION OF THE DRAWINGS

Other aspects of the invention will become apparent upon reading the following detailed description and upon reference to the accompanying drawings in which.

Figure 1:
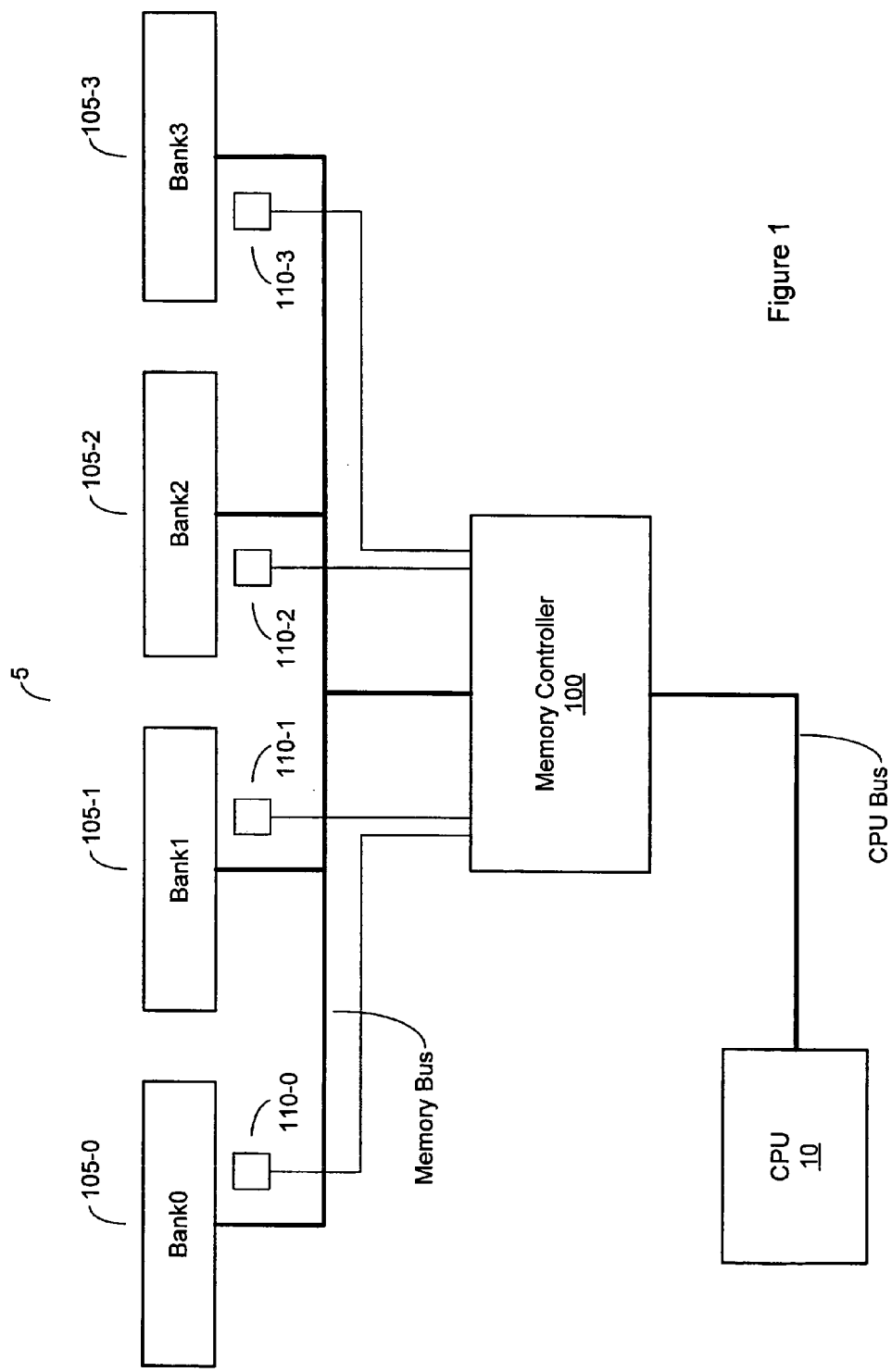
FIG. 1 is a block diagram of one embodiment of a computer system having a memory subsystem with a variable refresh rate.

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling with the spirit and scope of the present invention as defined by the appended claims.

DETAILED DESCRIPTION OF THE INVENTION

Turning now to FIG. 1, a block diagram of one embodiment of a computer system having a memory subsystem with a variable refresh rate is shown. In the embodiment shown, computer system 10 includes a central processing unit (CPU) 10 coupled to memory controller 100 via a CPU bus. In this particular embodiment, memory controller 100 is couple to, via a memory bus, four banks of memory, Bank0 through Bank3. These memory banks are implemented using memory modules 105-0 through 105-3, respectively. Embodiment having a greater or lesser number of memory banks are possible and contemplated, as well as memory banks having multiple memory modules. Each of the memory modules 105-0 through 105-3 may include one or more DRAM (dynamic random access memory) devices.

Memory controller 100 is configured to control accesses to each of the memory banks. This includes access to the memory banks for both read and write operations. Memory controller is also configured to initiate refresh cycles to the DRAM devices of each memory bank. DRAM devices store information in the form of a charge and are subject to leakage currents, and thus periodic refresh cycles are necessary to maintain the charge.

In the embodiment shown, computer system 5 includes a plurality of temperature sensing devices 110. Embodiments having only a single temperature sensor are possible and contemplated. In this particular embodiment, one temperature sensor each is associated with a respective memory bank. Each temperature sensor is coupled to memory controller 100, although embodiments where the temperature sensors are directly coupled to a unit (or units) other than the memory controller are possible and contemplated. Temperature sensing devices may be implemented using thermometers or other temperature sensing devices.

During the operation of computer system 5, memory access may generate heat in the memory banks. Typically, the higher access rates correspond with the generation of greater amounts of heat, and therefore increasing temperatures of the DRAM devices in the memory banks. At higher temperatures, the leakage currents of DRAM devices tend to increase, and therefore data integrity may be affected. In the embodiment shown, memory controller 100 is configured to increase the refresh rate of each of the memory banks at higher temperatures. Memory controller 100 is coupled to receive a temperature input from each of the temperature sensors 110. The temperature values received from the temperature sensing devices 105 may each be compared with a corresponding temperature threshold. If a temperature value received from one of the temperature sensing devices 110 exceeds a preset temperature threshold value, memory controller 100 may respond by increasing the refresh rate to the corresponding bank of memory. Thus, by increasing the refresh rate, data integrity in the affected DRAM devices may be preserved.

Memory controller 100 may continue performing refreshes at the increased rate until the temperature falls below the temperature threshold value, or at some other temperature threshold value that is less than the first one. Thus, memory bandwidth need not be adversely affected when the temperature sensed near an associated memory bank is less than the threshold temperature.

In some embodiments, multiple temperature threshold settings may be used. Each time a sensed temperature exceeds one of the thresholds, the refresh rate for a corresponding memory bank may be increased. Similarly, each time the sensed temperature falls below one of the thresholds, the refresh rate for a corresponding memory bank may be reduced.

Embodiments having no temperature sensors are also possible and contemplated. In such embodiments, instead of relying on temperature readings to adjust the refresh rate, a memory controller may monitor the access rate for one or more memory banks. A temperature of the memory banks may be estimated or extrapolated based on the memory access rate. If the access rate increases to a point at which the estimated/extrapolated temperature is exceeded, the memory controller may increase the refresh rate in order to reduce the access rate.

Figure 2:
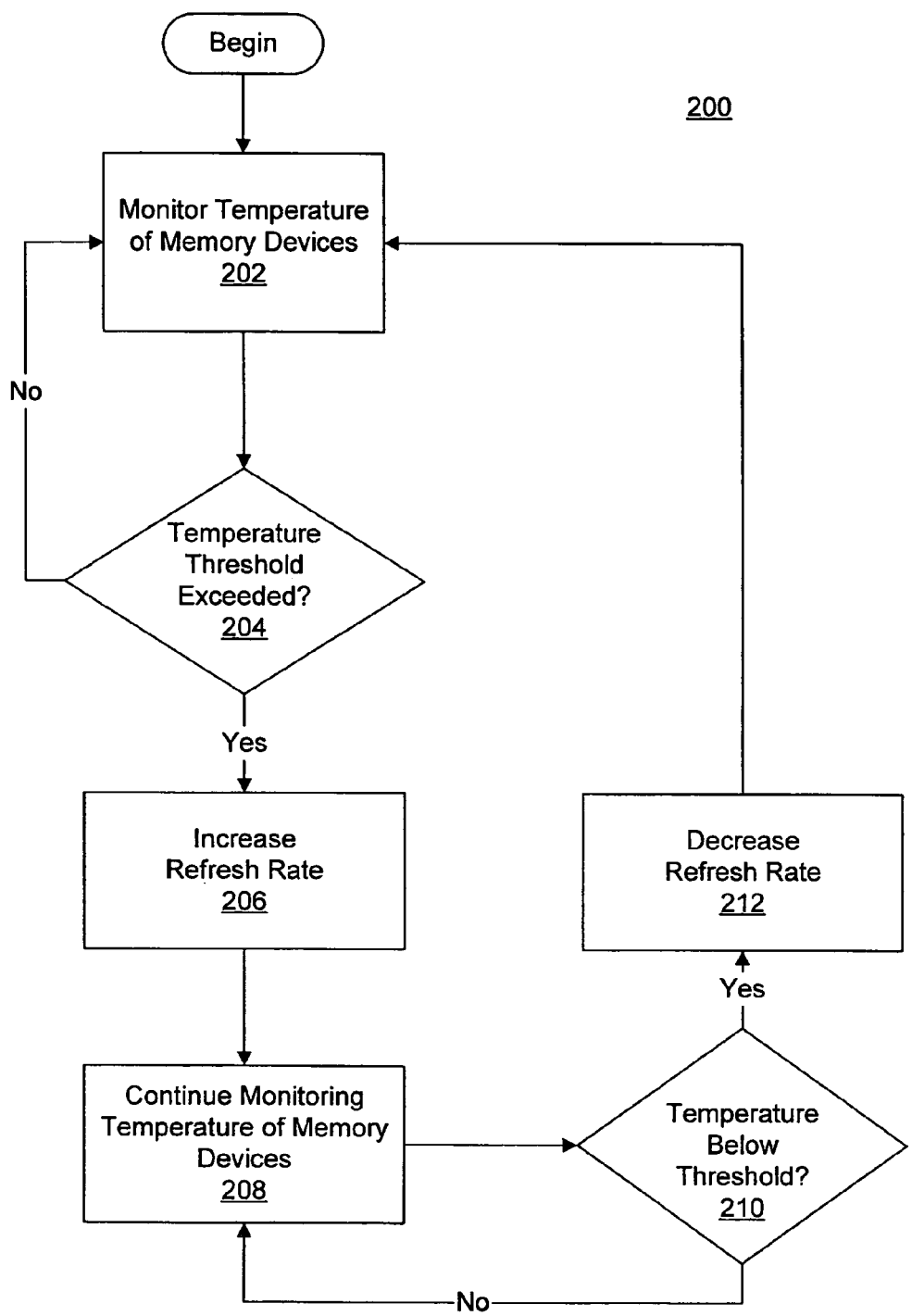
FIG. 2 is a flow diagram of one embodiment of the operation of a memory subsystem.

FIG. 2 is a flow diagram of one embodiment of the operation of a memory subsystem. More particularly, method 200 illustrates an embodiment of a method of operation for a memory subsystem having DRAM devices, wherein a memory controller is configured to change the refresh rate of the DRAM devices responsive to a temperature change. Method 200 begins with the monitoring of the temperature of the memory devices (202). Such monitoring may be performed in some embodiments by one or more temperature sensors placed in the vicinity of DRAM devices in a computer system. In other embodiments, the monitoring may be performed indirectly by extrapolating a temperature value by monitoring a memory access rate. In either case, such monitoring may be performed independently for a plurality of memory banks, or may be performed in a single instance for all memory banks.

The temperature that is monitored in 202 may be compared to a threshold temperature. If the temperature is less than the threshold temperature, the monitoring of 202 may continue with no change in the refresh rate. However, if the temperature threshold is exceeded for a given one or more DRAM devices, the rate at which a refresh cycle is applied to those devices may be increased (206). This increased refresh rate may help maintain the integrity of data, since leakage currents typically increase at higher temperatures. Furthermore, since the amount of time to perform a refresh is small compared to the amount of time to perform a memory access, memory access bandwidth may not be significantly affected by the increased refresh rate.

After the increasing of the refresh rate, monitoring of the temperature of the memory devices may resume (208). If the temperature falls below the threshold (210, yes), the refresh rate may be lowered. Otherwise, monitoring may continue (210, no, to 208).

Although the embodiment discussed above alludes to only a single temperature threshold, embodiments having multiple temperature thresholds are possible and contemplated. In such embodiments, the refresh rates may be increased each time a temperature threshold is exceeded by a measured or extrapolated temperature, while the refresh rate may be lowered each time the measured or extrapolate temperature falls below a given threshold. The thresholds may be set based on various factors such as error rates for a given number of memory cycles.

Figure 3:
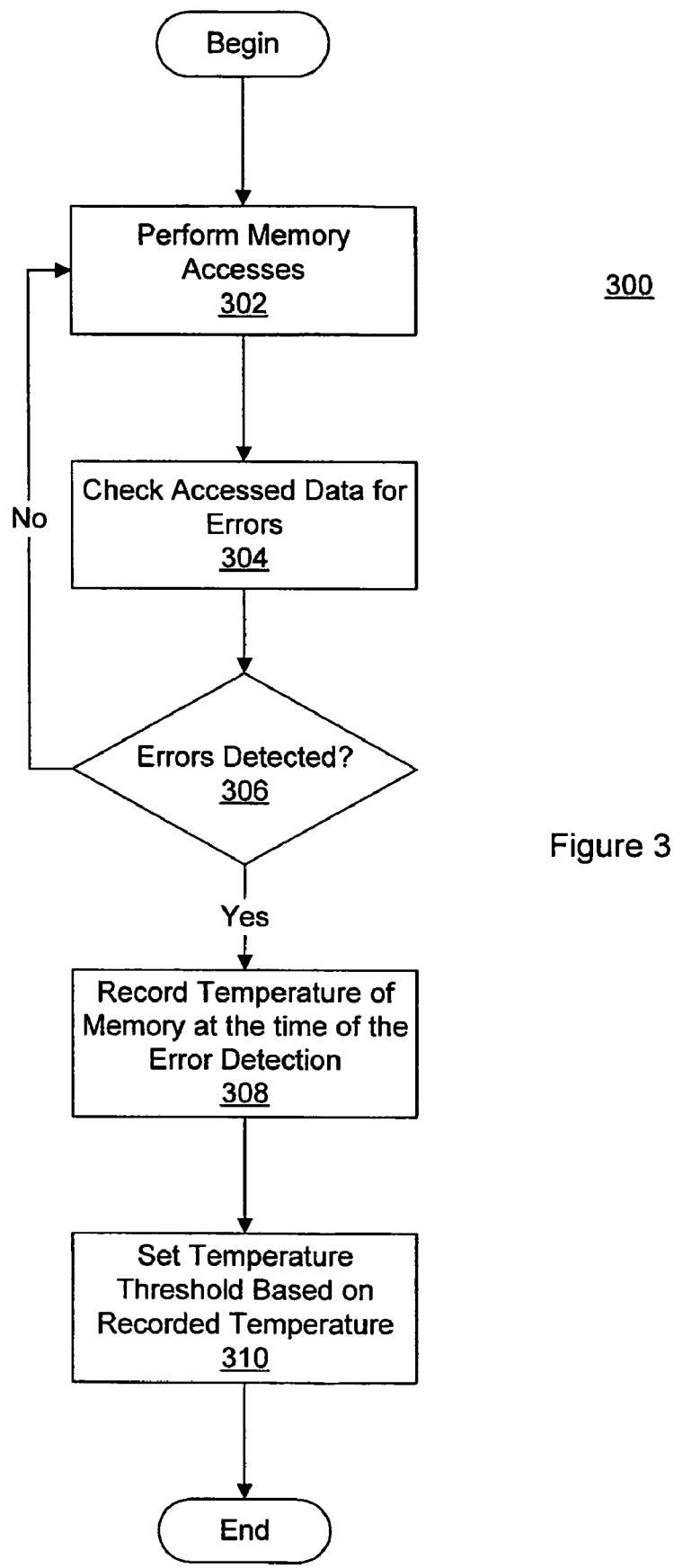
FIG. 3 is a flow diagram of one embodiment of an operation to determine a temperature threshold for one embodiment of a memory subsystem.

FIG. 3 is a flow diagram of one embodiment of an operation to determine a temperature threshold for one embodiment of a memory subsystem. In the embodiment shown, method 300 begins with the performing of a memory access. Using an error correction subsystem, the data accessed from the memory is checked for errors (304). If no errors are detected, the cycle repeats beginning with 302. Typically, with each iteration, the temperature of the accessed DRAM devices will increase. If an error is detected (306, yes), then the temperature at which the error occurred is recorded (308). A temperature threshold is then set based on the recorded temperature (310).

The actual temperature threshold setting need not be the same value as the temperature recorded when the error occurred. In some embodiments, the actual temperature threshold setting may be lower than the temperature at which the error occurred. This may allow a safety margin to be provided.

The method may also be expanded on to establish multiple thresholds as well thresholds for memory access rates. For example, the method may perform a plurality of memory accesses at a predetermined rate and may also record an error rate (e.g., number of errors recorded per 1000 accesses). A threshold may be set based either on a temperature recorded during the memory accesses (such as an average temperature), or may be set based on the access rate itself if no temperature sensors are provided. This may be repeated for a number of different access rates. Furthermore, embodiments that include thresholds for both temperature and access rates are possible and contemplated.

Although the term 'computer system' has been used to describe a system in which the method and apparatus described above is implemented, it should be noted that the method and apparatus may be implemented in virtually any system having a memory subsystem including DRAM devices.

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims.

What is claimed is:

1. A method comprising:
   providing a periodic refresh cycle to one or more DRAM (dynamic random access memory) devices in a computer system, including providing a periodic refresh cycle at a first refresh rate to a first bank of DRAM devices and providing a periodic refresh cycle at a second refresh rate to a second bank of DRAM devices;
   monitoring an access rate at which the one or more DRAM devices is accessed, said monitoring including monitoring an access rate of a first bank of DRAM devices and an access rate of second bank of DRAM devices;
   increasing the first refresh rate if a temperature extrapolated from the access rate of the first bank exceeds a preset temperature threshold;
   increasing the second refresh rate if a temperature extrapolated from the access rate of the second bank exceeds a preset temperature threshold;
   reducing the first refresh rate if the access rate of the first bank falls below the preset temperature threshold; and
   reducing the second refresh rate if the access rate of the second bank falls below the preset temperature threshold;
   wherein the method further comprises:
      adjusting the first refresh rate of the first bank of DRAM devices based on one or more preset access rate values; and
      adjusting the second refresh rate of the second bank of DRAM devices based on the one or more preset access rate values independently of adjusting the first refresh rate.

2. The method as recited in claim 1 further comprising increasing the first refresh rate each time the access rate of the first bank exceeds one of a plurality of a preset temperature thresholds, and further comprising increasing the second refresh rate each time the access rate of the second bank exceeds one of the plurality of preset temperature thresholds.

3. The method as recited in claim 2 further comprising reducing the first refresh rate each time the access rate of the first bank falls below one of the plurality of a preset temperature thresholds, and further comprising reducing the second refresh rate each time the access rate of the second bank falls below one of the plurality of preset temperature thresholds.

4. The method as recited in claim 1 further comprising reducing the first refresh rate and the second refresh rate when the computer system enters an idle state.

5. A computer system comprising:
   one or more DRAM (dynamic random access memory) devices; and
   a memory controller coupled to the one or more DRAM devices including a first bank of DRAM devices and a second bank of DRAM devices, wherein the memory controller is configured to periodically initiate a refresh cycle for the one or more DRAM devices, and wherein the memory controller is further configured to increase a first refresh rate if a temperature extrapolated from an access rate of the first bank exceeds a temperature threshold and increase a second refresh rate if a temperature extrapolated from an access rate of the second bank exceeds a temperature threshold;
   wherein the computer system is configured to reduce the first refresh rate if the temperature extrapolated from the access rate of the first bank falls below the preset threshold and reduce the second refresh rate if the temperature extrapolated from the access rate of the second bank falls below the preset temperature threshold;
   and wherein the computer system is further configured to:
      adjust the first refresh rate based on one or more preset access rate values; and
      adjust the second refresh rate based on the one or more preset access rate values independently of adjusting the first refresh rate.

6. The computer system as recited in 5, wherein the computer system is configured to increase one of the first or second refresh rate each time the access rate of the corresponding first or second bank exceeds one of a plurality of a preset access rate thresholds.

7. The computer system as recited in claim 6, wherein the computer system is configured to reduce one of the first or second refresh rate each time the access rate of the corresponding first or second bank falls below one of a plurality of a preset access rate thresholds.

8. The computer system as recited in claim 5, wherein the computer system is configured to reduce the first refresh rate and the second refresh rate when the computer system enters an idle state.

9. A computer system comprising:
   one or more DRAM (dynamic random access memory) devices; and
   a memory controller coupled to the one or more DRAM devices including a first bank of DRAM devices and a second bank of DRAM devices, wherein the memory controller is configured to periodically initiate a refresh cycle for the one or more DRAM devices, and wherein the memory controller is further configured to increase a rate at which the periodic refresh cycle is performed if a temperature of the one or more DRAM devices exceeds a preset temperature threshold;
   wherein the computer system is configured to determine the preset temperature threshold by determining an error temperature, wherein the error temperature is an approximate temperature of the one or more DRAM devices at which an error has occurred in data accessed from the one or more DRAM devices, and wherein the computer system is configured to monitor the temperature and control the refresh rate of each of the first and second banks of DRAM devices independently of each other.

10. The computer system as recited in claim 9, wherein determining the error temperature comprises:
   performing memory accesses in order to increase the temperature of the one or more DRAM devices;
   performing error checking of data accessed from the one or more DRAM devices during said memory accesses;
   detecting an error in the data accessed from the one or more DRAM devices; and
   recording the approximate temperature at which the error occurred, wherein the approximate temperature is the error temperature.

11. The computer system as recited in claim 9, wherein the temperature of the one or more DRAM devices is determined by one or more temperature sensing devices located in the vicinity of the one or more DRAM devices.

12. The computer system as recited in claim 9, wherein the computer system is configured to increase the rate at which the periodic refresh cycle is performed each time the temperature of the one or more DRAM devices exceeds one of a plurality of a preset temperature thresholds.

13. The computer system as recited in claim 9, wherein the computer system is configured to reduce the rate at which the periodic refresh cycle is performed each time the temperature of the one or more DRAM devices falls below one of a plurality of a preset temperature thresholds.

* * * * *